US011257390B2

(12) United States Patent
Wickman et al.

(10) Patent No.: US 11,257,390 B2
(45) Date of Patent: *Feb. 22, 2022

(54) EVALUATION OF A SIMULATED VEHICLE-RELATED FEATURE

(71) Applicant: Volvo Car Corporation, Gothenburg (SE)

(72) Inventors: Casper Wickman, Ockerö (SE);
Mattias Wikenmalm, Torslanda (SE);
Timotei Ghiurau, Gothenburg (SE);
Jon Seneger, Boulder Creek, CA (US)

(73) Assignee: Volvo Car Corporation, Gothenburg (SE)

( * ) Notice: Subject to any disclaimer, the term of this patent is extended or adjusted under 35 U.S.C. 154(b) by 199 days.

This patent is subject to a terminal disclaimer.

(21) Appl. No.: 16/672,756

(22) Filed: Nov. 4, 2019

(65) Prior Publication Data

US 2020/0184841 A1 Jun. 11, 2020

(30) Foreign Application Priority Data

Dec. 7, 2018 (EP) .................................. 18210988

(51) Int. Cl.
*G09B 9/05* (2006.01)
*G02B 27/01* (2006.01)
(Continued)

(52) U.S. Cl.
CPC .......... *G09B 9/05* (2013.01); *G02B 27/0172* (2013.01); *G02B 27/0179* (2013.01);
(Continued)

(58) Field of Classification Search
CPC .......... G09B 9/05; G09B 9/042; G06F 30/20; G02B 27/0172; G02B 27/0179;
(Continued)

(56) References Cited

U.S. PATENT DOCUMENTS

2019/0130878 A1* 5/2019 Bradley ................ G01C 21/365
2019/0188912 A1* 6/2019 Kamini .................... G08G 1/00

OTHER PUBLICATIONS

May 23, 2019 European Search Report issued on international U.S. Appl. No. 18/210,988.
(Continued)

*Primary Examiner* — Chong Wu
(74) *Attorney, Agent, or Firm* — Clements Bernard Walker; Christopher L. Bernard

(57) ABSTRACT

A method performed by a vehicle feature evaluation system (1) for enabling evaluation of a simulated vehicle-related feature. The vehicle feature evaluation system determines (1001) in relation to a road-driven vehicle (2), with support from a tracking system (5), an orientation of a head-mounted display (4), HMD, adapted to be worn by an occupant (3) on-board the road-driven vehicle. The vehicle feature evaluation system further determines (1002) a simulated vehicle design feature to be evaluated in the road-driven vehicle. Moreover, the vehicle feature evaluation system provides (1006) in real-time to a HMD display (41) of the HMD, taking into consideration the HMD orientation, a virtual representation (7) of the simulated vehicle design feature superimposed on a real-time surrounding-showing video stream (6) derived from real-world image data (211) captured with support from one or more vehicle-attached cameras (21) adapted to capture surroundings external of the road-driven vehicle.

15 Claims, 6 Drawing Sheets

(51) Int. Cl.
  *G09B 9/042*   (2006.01)
  *G06F 30/20*   (2020.01)
(52) U.S. Cl.
  CPC ............. *G06F 30/20* (2020.01); *G09B 9/042* (2013.01); *G02B 2027/0181* (2013.01); *G02B 2027/0183* (2013.01); *G02B 2027/0187* (2013.01)
(58) Field of Classification Search
  CPC .... G02B 2027/0181; G02B 2027/0183; G02B 2027/0187
  See application file for complete search history.

(56) References Cited

OTHER PUBLICATIONS

Frund J. et al., "Cooperative design support within automobile advance development using augmented reality technology", Computer Supported Cooperative Work In Design, 2004.

Hobson, "MINI's augmented-reality glasses can make cars transparent" Apr. 24, 2015, pp. 1-10.

Toshikazu Ohshima et al.,"A Mixed Reality System with Visual and Tangible Interaction Capability—Application to Evaluating Automobile Interior Design",The second IEEE and ACM international symposium on mixed and augmented reality, Oct. 10, 2003, IEEE Computer Society.

Purschke F et al., "Virtual reality-new Methods for Improving and Accelerating the Development Process in Vehicle Styling and Design", Computer Graphics International, 1998. Jun. 22, 1998, pp. 789-797.

\* cited by examiner

EVALUATION OF A SIMULATED VEHICLE-RELATED FEATURE

CROSS-REFERENCE TO RELATED APPLICATION

The present disclosure claims the benefit of priority of co-pending European Patent Application No. 18210988.4, filed on Dec. 7, 2018, and entitled "EVALUATION OF A SIMULATED VEHICLE-RELATED FEATURE," the contents of which are incorporated in full by reference herein.

TECHNICAL FIELD

The present disclosure relates to enabling evaluation of a simulated vehicle-related feature.

BACKGROUND

In the automotive field, when evaluating new vehicle functions, interaction designs, interaction models and/or new product designs, it is known to provide a virtually modelled evaluation environment. Static or dynamic evaluation rigs are commonly utilized, where the static rig for instance may be represented by a non-movable rig that may display the environment and traffic on large scale screens in front of a vehicle mock-up, and where the dynamic rig for instance may be represented by a similar rig with the difference that the dynamic rig may move in order to simulate acceleration forces and/or movement. A drawback for both static and dynamic rigs is that the test subject may feel motion sickness. Yet another drawback is that the environment as well as the traffic in fact is simulated. The latter results in that the interaction therewith may become somewhat artificial, and it may be difficult to validate that the result actually corresponds to an experience in a real vehicle, in real traffic. Furthermore, for evaluation of a complete vehicle—such as e.g. dimensions and/or designs thereof—it is commonly known in the art to build a physical mock-up. With this approach, however, it is not possible to drive and evaluate in an authentic and/or real environment. Accordingly, there is room for improvement and/or for alternative solutions when it comes to evaluating a complete vehicle or at least a portion thereof with functions, interaction models and/or design(s) in order to verify and/or validate concepts.

SUMMARY

It is therefore an object of embodiments herein to provide an improved and/or alternative approach supporting evaluation of virtual vehicle designs and/or concepts.

According to a first aspect of embodiments herein, the object is achieved by a method performed by a vehicle feature evaluation system for enabling evaluation of a simulated vehicle-related feature. The vehicle feature evaluation system determines in relation to a road-driven vehicle, with support from a tracking system, an orientation of a head-mounted display, HMD, adapted to be worn by an occupant on-board the road-driven vehicle. The vehicle feature evaluation system further determines a simulated vehicle design feature to be evaluated in the road-driven vehicle. Moreover, the vehicle feature evaluation system provides in real-time to a HMD display of the HMD, taking into consideration the HMD orientation, a virtual representation of the simulated vehicle design feature superimposed on a real-time surrounding-showing video stream derived from real-world image data captured with support from one or more vehicle-attached cameras adapted to capture surroundings external to the road-driven vehicle.

Thereby, there is introduced an approach which enables a virtual version of a feature related to and/or associated with a vehicle to be evaluated without a need to build a physical mock-up for evaluation. That is, since there is determined in relation to a road-driven vehicle, with support from a tracking system, an orientation of a head mounted display, HMD, adapted to be worn by an occupant on-board the road-driven vehicle, there is established a position and/or location of an occupant-worn HMD in view of a real vehicle e.g. adapted to and/or intended to be driven outdoors such as in real traffic and/or along actual roads. Thus, with the HMD-wearing occupant being positioned in a road-driven vehicle rather than in an e.g. indoor static or dynamic rig, evaluation may take place in an actual real vehicle. Furthermore, that is, since there is determined a simulated vehicle design feature to be evaluated in the road-driven vehicle, there is defined—e.g. computer-generated—a virtual vehicle design feature of interest to validate in a real vehicle. Moreover, that is, since there is provided in real-time to a HMD display of the HMD, taking into consideration the HMD orientation, a virtual representation of the simulated vehicle design feature superimposed on a real-time surrounding-showing video stream derived from real-world image data captured with support from one or more vehicle-attached cameras adapted to capture surroundings external to the road-driven vehicle, there is provided to the HMD display a real-time physical world view of surroundings external the road-driven vehicle—essentially as captured by the vehicle-attached camera(s)—electronically mixed with the computer-generated virtual design feature representation temporally and spatially commensurate with said physical world view such that the surrounding-showing video stream appears as a background overlaid with said virtual design feature representation. Thus, with the vehicle-attached camera(s) provided to capture surroundings external of the road-driven vehicle, the real-time surrounding-showing video stream shows surroundings and/or an environment exterior of the vehicle, hence excluding interior—and potentially at least partial exterior—views of said road-driven vehicle. Subsequently, with the HMD-wearing occupant being on-board the road-driven vehicle and with the HMD orientation being taken into consideration, provided to the HMD display is then a portion of surrounding-showing video stream corresponding to and/or spatially commensurate with a field of view of the HMD-wearing occupant. The HMD-wearing occupant would accordingly be shown—on the HMD display(s)—a physical world view spatially commensurate with said occupant's field of view, but from which physical world view an interior—and potentially at least a portion of an exterior—of the road-driven vehicle would be excluded due to the vehicle-attached camera(s) capturing surroundings external of—not internal of—the road-driven vehicle. Thus, the real-time surrounding-showing video stream may then represent what a driver or passenger of said road-driven vehicle would essentially see even if not wearing the HMD, but with interior—and potentially at least partial exterior—portions of the road-driven vehicle removed. Accordingly, with the interior—and potentially at least a portion of the exterior—of the road-driven vehicle essentially wiped out from the HMD-wearing occupant's physical world view, one or more simulated design features—e.g. represented by a simulated updated and/or new interior or exterior or a portion thereof—may be evaluated in its place. Thus, upon in real-time superimposing a virtual representation of a simulated vehicle design feature—such as e.g. a complete interior and parts of an exterior or e.g. at least a simulated dashboard—on the surrounding-showing video stream, said simulated vehicle design feature e.g. simulated dashboard may be evaluated in a road-driven vehicle, e.g. while said road-driven vehicle is driven in real traffic and/or along actual roads. Thereby, with the exception of the virtual design feature representation, the entire test environment is authentic and/or real. Consequently, the simulated vehicle design feature may be evaluated in real traffic and/or in real road-driving scenarios, which thus enables said simulated vehicle design feature to be evaluated under more reality-resembling conditions and/or in a more reality-resembling environment than should said evaluation be performed in e.g. a commonly known physical mock-up.

For that reason, an improved and/or alternative approach is provided supporting evaluation of virtual vehicle designs and/or concepts. The technical features and corresponding advantages of the above mentioned method will be discussed in further detail in the following.

By introducing a method performed by a vehicle feature evaluation system for enabling evaluation of a simulated vehicle-related feature, an approach is provided which enables a virtual version of a feature related to and/or associated with a vehicle to be evaluated without a need to build a physical mock-up for evaluation. The expression "vehicle feature evaluation system" may refer to "vehicle feature validation system", "vehicle evaluation system", "evaluation system" and/or "evaluation supporting system", whereas "for enabling evaluation of" may refer to "for evaluating" and/or "for providing". Furthermore, "enabling" evaluation may refer to "supporting" evaluation, whereas "evaluation" may refer to "validation", "testing" and/or "analysis". "Simulated" vehicle-related feature, on the other hand, may refer to "virtual", "computer-generated", "modelled" and/or "fictive" vehicle-related feature, whereas "a simulated vehicle-related feature" may refer to "a simulated vehicle design feature", "a simulated vehicle design", "a simulated vehicle concept", "a simulated vehicle feature" and/or "simulated vehicle characteristics". According to an example, the expression "for enabling evaluation of a simulated vehicle-related feature" may refer to "for enabling evaluation of a simulated vehicle-related feature in a road-driven vehicle".

Since the vehicle feature evaluation system determines in relation to a road-driven vehicle, with support from a tracking system, an orientation of a head mounted display, HMD, adapted to be worn by an occupant on-board the road-driven vehicle, there is established a position and/or location of an occupant-worn HMD in view of a real vehicle e.g. adapted to and/or intended to be driven outdoors such as in real traffic and/or along actual roads. Thus, according to the introduced inventive concept and as will be described in further detail further on, with the HMD-wearing occupant—which may also be referred to as the test subject—being positioned in a road-driven vehicle rather than in an e.g. indoor static or dynamic rig, evaluation may take place in an actual real vehicle. Determining the orientation of the HMD in relation to the road-driven vehicle, with support from the tracking system, may be accomplished as commonly known in the art, for instance with input from tracking sensors such as cameras, accelerometers, magnetometers and/or gyroscopes, and/or based on software tracking e.g. aligning markers in the vehicle with corresponding markers in the virtual model. The HMD, on the other hand, may comprise and/or support any arbitrary features known in the art from HMDs commonly utilized today, with the addition of further features that will be described further on. The referred to "vehicle" may be represented by any arbitrary vehicle, for instance an engine-propelled vehicle, such as e.g. a car, truck, lorry, van, tractor and/or bus. The expression "road-driven vehicle", on the other hand, may refer to "real vehicle", "outdoor vehicle", "vehicle adapted to be driven in real traffic" and/or "vehicle adapted to be driven along outdoor tracks and/or public roads and/or public road networks". "Determining" in relation to a road-driven vehicle may refer to "calculating and/or analysing" in relation to a road-driven vehicle and/or "determining optically, magnetically and/or by means of laser" in relation to a road-driven vehicle. "In relation to" may refer to "in view of" and/or "in comparison to". "In relation to a road-driven vehicle" may further refer to "in relation to a reference point of a road-driven vehicle", which "reference point" may be arbitrarily selected as deemed adequate for the implementation at hand. The expression "with support from" a tracking system may refer to "by means of" a tracking system and/or "with input from" a tracking system, whereas "a tracking system", on the other hand, may refer to "one or more tracking sensors" and/or "a software based tracking system". "An orientation" of a head-mounted display may refer to "a position and/or location of" a head-mounted display, whereas "head-mounted display" may refer to "augmented reality and/or virtual reality head-mounted display", "goggles" and/or "electronic goggles". The expression "adapted to be worn by" an occupant may refer to "adapted to be worn at least partly in front of the eyes of" an occupant and/or merely "worn by" an occupant, whereas "an occupant" may refer to "a vehicle occupant", "a driver" and/or "a test subject". "On-board" the road-driven vehicle may refer to "positioned in", "seated in a front seat of" and/or "seated in a driver's seat of" the road-driven vehicle.

Since the vehicle feature evaluation system determines a simulated vehicle design feature to be evaluated in the road-driven vehicle, there is defined—e.g. computer-generated—a virtual vehicle design feature of interest to validate in a real vehicle. "Determining" a simulated vehicle design feature may refer to "computer-generating", "simulating" and/or "modelling" a simulated vehicle design feature, whereas vehicle "design feature" may refer to vehicle "characteristics" and further to merely vehicle "feature" and/or vehicle "concept". According to an example, "determining" a simulated vehicle design feature may refer to "determining logic, design, graphics, aesthetics, geometries and/or functionality of" a simulated vehicle design feature.

Since the vehicle feature evaluation system provides in real-time to a HMD display of the HMD, taking into consideration the HMD orientation, a virtual representation of the simulated vehicle design feature superimposed on a real-time surrounding-showing video stream derived from real-world image data captured with support from one or more vehicle-attached cameras adapted to capture surroundings external to the road-driven vehicle, there is provided to the HMD display a real-time physical world view of surroundings external the road-driven vehicle—essentially as captured by the vehicle-attached camera(s)—electronically mixed with the computer-generated virtual design feature representation temporally and spatially commensurate with said physical world view such that the surrounding-showing video stream appears as a background overlaid with said virtual design feature representation. Thus, live imagery from the physical world is electronically merged with computer-generated imagery, a concept commonly referred to as mixed reality and/or augmented reality. More specifically, the virtual representation of the simulated vehicle design feature is overlaid the surrounding-showing video stream, a concept commonly referred to as video see-through. That is, with the vehicle-attached camera(s) provided to capture surroundings external of the road-driven vehicle, the real-time surrounding-showing video stream shows surroundings and/or an environment exterior of the vehicle, hence excluding interior—and potentially at least partial exterior—views of said road-driven vehicle. Subsequently, with the HMD-wearing occupant being on-board the road-driven vehicle—e.g. seated in a driver's seat or passenger's seat thereof—and with the HMD orientation being taken into consideration, provided to the HMD display is then a portion of surrounding-showing video stream—derived from real-world image data captured with support from the vehicle-attached camera(s)—corresponding to and/or spatially commensurate with a field of view of the HMD-wearing occupant. The HMD-wearing occupant would accordingly be shown—on the HMD display(s)—a physical world view spatially commensurate with said occupant's field of view, but from which physical world view an interior—and potentially at least a portion of an exterior—of the road-driven vehicle would be excluded due to the vehicle-attached camera(s) capturing surroundings external of—not internal of—the road-driven vehicle. Thus, the real-time surrounding-showing video stream may then represent what a driver or passenger of said road-driven vehicle would essentially see even if not wearing the HMD, but with interior—and potentially at least partial exterior—portions of the road-driven vehicle removed. Accordingly, with the interior—and potentially at least a portion of the exterior—of the road-driven vehicle essentially wiped out from the HMD-wearing occupant's physical world view, one or more simulated design features—e.g. represented by a simulated updated and/or new interior or exterior or a portion thereof—may be evaluated in its place. Thus, upon in real-time superimposing a virtual representation of a simulated vehicle design feature—such as e.g. a complete interior and parts of an exterior or e.g. at least a simulated dashboard or a portion thereof—on the surrounding-showing video stream, said simulated vehicle design feature e.g. simulated dashboard may be evaluated in a road-driven vehicle, e.g. while said road-driven vehicle is driven in real traffic and/or along actual roads. Thereby, with the exception of the virtual design feature representation, the entire test environment is authentic and/or real. Consequently, the simulated vehicle design feature may be evaluated in real traffic and/or in real road-driving scenarios, which thus enables said simulated vehicle design feature to be evaluated under more reality-resembling conditions and/or in a more reality-resembling environment than should said evaluation be performed in e.g. a commonly known physical mock-up.

"Providing" to a HMD display may refer to "providing wirelessly", "rendering" and/or "transmitting" to a HMD display and/or "generating, processing, rendering and/or producing, and providing" to a HMD display, whereas "HMD display" may refer to "one or more HMD displays". Providing "in real-time", on the other hand, may refer to providing "essentially in real-time" and/or "live", and further to that the virtual representation superimposed on the real-world video stream is provided to the HMD display substantially close to the time of the actual capturing of the real-world image data. According to an example, "providing in real-time" may refer to merely "providing". The expression "taking into consideration" the HMD orientation may refer to "considering" and/or "taking into consideration for positioning and/or spatial positioning" the HMD orientation, whereas "taking into consideration the HMD orientation" may refer to "taking into consideration a field of view of the occupant derived from the HMD orientation" and/or "taking into consideration the HMD orientation and/or a field of view of the occupant derived from the HMD orientation". "Virtual" representation, on the other hand, may refer to "augmented" and/or "overlaid" representation, whereas "representation" may refer to "augmentation", "data" and/or "geometrical and/or graphical model". According to an example, "representation" may further refer to "graphical model", "computer-aided design, CAD, geometrics and/or design surface model, DSM, geometrics" and/or "result from computer-aided engineering, CAE". "Superimposed on" a real-time surrounding-showing video stream, on the other hand, may refer to "overlaid", "virtually overlaid", "placed and/or displayed in front of" a real-time surrounding-showing video stream, whereas "a real-time" surrounding-showing video stream may refer to "an essentially real-time", "a live or essentially live" and/or "instant or essentially instant" surrounding-showing video stream. The term "real-time" surrounding-showing video stream may further indicate that the surrounding-showing video stream is derived in a timeframe substantially close to the time of the actual capturing of the real-world image data. "Real-world", on the other hand, may refer to "physical world" and/or "real environment world", whereas "video stream" may refer to "streaming video" and/or merely "video". "Derived from" real-world image data may refer to "which video stream is based on" real-world image data, whereas "real-world image data" may refer to "video data" and/or "images". "Captured" with support from one or more vehicle-attached cameras, on the other hand, may refer to "taped" and/or "filmed" with support from one or more vehicle-attached cameras, whereas captured "with support from" one or more vehicle-attached cameras may refer to captured "by" and/or "by means of" one or more vehicle-attached cameras. Furthermore, "one or more" vehicle-attached cameras may according to an example refer to "at least two" vehicle-attached cameras, whereas "vehicle-attached cameras" may refer to "cameras fixed to, mounted on and/or comprised in the road-driven vehicle", and further to "vehicle-attached surrounding-capturing cameras". The expression "adapted to capture" surroundings external to the road-driven vehicle may refer to "adapted to film and/or record" and/or "adapted to capture images of" surroundings external to the road-driven vehicle, and further to "capturing" surroundings external to the road-driven vehicle. Moreover, "external of" the road-driven vehicle may refer to "on the outside of" the road-driven vehicle, and further to "external to" and/or merely "external" the road-driven vehicle.

According to an example, the expression "adapted to capture surroundings external to the road-driven vehicle" may refer to "adapted to capture surroundings external to the road-driven vehicle at least in a forward direction of the road-driven vehicle, preferably additionally in a sideway, backward, upward and/or downward direction of the road-driven vehicle". According to another example, the expression "real-time surrounding-showing video stream derived from real-world image data captured with support from one or more vehicle-attached cameras adapted to capture surroundings external of the road-driven vehicle" may refer to "real-time surrounding-showing video stream derived from real-world image data captured with support from one or more vehicle-attached cameras adapted to capture surroundings external of the road-driven vehicle, wherein the real-time surrounding-showing video stream comprises a first real-time video stream from a first vehicle-attached camera adapted to capture surroundings external of the road-driven vehicle in a first direction, stitched with at least a second real-time video stream from at least a second vehicle-attached camera adapted to capture surroundings external of the road-driven vehicle in a second direction differing from the first direction".

Optionally, the simulated vehicle design feature may comprise a simulated vehicle interior section and/or a simulated vehicle exterior section. Thereby, a virtual vehicle interior portion—e.g. a simulated dashboard—and/or a virtual vehicle exterior portion—e.g. a simulated hood—may be evaluated in the road-driven vehicle, such as e.g. new and/or updated design, colour, material and/or user interface thereof and/or e.g. geometrics for instance CAD and/or DSM geometrics thereof. The expression simulated "vehicle interior section" may refer to simulated "at least a portion of a vehicle interior section", and further to simulated "vehicle interior portion" and/or simulated "visual and/or uncovered vehicle interior section". In a similar manner, the expression simulated "vehicle exterior section" may refer to simulated "at least a portion of a vehicle exterior section", and further to simulated "vehicle exterior portion" and/or simulated "visual and/or uncovered vehicle exterior section".

Optionally, the vehicle feature evaluation system may determine a simulated vehicle functionality feature to be evaluated in the road-driven vehicle. Providing to the HMD display may then further comprise additionally providing in real-time to the HMD display of the HMD, taking into consideration the HMD orientation, a virtual representation of the simulated vehicle functionality feature superimposed on the real-time surrounding-showing video stream. The simulated vehicle functionality feature may e.g. comprise a simulated vehicle human machine interface, HMI, a simulated vehicle display, a simulated vehicle head-up display, HUD, simulated light characteristics, and/or a simulated effect resulting from a simulation of the simulated vehicle functionality feature. Thereby, there is defined—e.g. computer-generated—a virtual vehicle functionality feature of interest to validate in a real vehicle. Furthermore, thereby, the virtual representation of the simulated vehicle functionality feature is overlaid the real-world video stream to be temporally and spatially commensurate with the video stream such that said video stream appears as a background overlaid with—in addition to the virtual design feature representation—said virtual functionality feature representation. Accordingly, upon in real-time superimposing a virtual representation of a simulated vehicle functionality feature—such as for instance a virtual display with e.g. new and/or updated design and/or functionality—on the surrounding-showing video stream, said simulated vehicle functionality feature may be evaluated in the road-driven vehicle, e.g. while said road-driven vehicle is driven in real traffic and/or along actual roads. Consequently, the simulated vehicle functionality feature may be evaluated in real traffic and/or in real road-driving scenarios, which thus enables said simulated vehicle functionality feature to be evaluated under more reality-resembling conditions and/or in a more reality-resembling environment than should said evaluation be performed in e.g. a commonly known static or dynamic rig displaying the environment and traffic on large scale screens in front of a vehicle mock-up. Should the simulated vehicle functionality feature comprise a simulated vehicle human machine interface, HMI, then a virtual vehicle HMI may be evaluated in the road-driven vehicle, such as e.g. graphics thereof and/or new and/or updated functionality and/or design thereof. On the other hand, should the simulated vehicle functionality feature additionally or alternatively comprise a simulated vehicle display, then a virtual vehicle display e.g. an infotainment display may be evaluated in the road-driven vehicle, such as e.g. graphics thereof and/or new and/or updated functionality and/or design thereof. Moreover, should the simulated vehicle functionality feature additionally or alternatively comprise a simulated vehicle head-up display, HUD, then a virtual vehicle HUD may be evaluated in the road-driven vehicle, such as e.g. graphics thereof and/or new and/or updated functionality and/or design thereof. Should the simulated vehicle functionality feature on the other hand additionally or alternatively comprise simulated light characteristics, then virtual light characteristics e.g. interior light characteristics may be evaluated in the road-driven vehicle, such as e.g. new and/or updated appearance and/or ambience of e.g. interior lighting. Moreover, should the simulated vehicle functionality feature additionally or alternatively comprise a simulated effect resulting from a simulation of the simulated vehicle functionality feature, then a virtual effect resulting from simulation of a simulated vehicle functionality feature e.g. wiper performance, cabin climate, air flow, contamination etc. may be evaluated in the road-driven vehicle, such as e.g. the effect of a computer-aided engineering, CAE, simulation thereof. "Determining" a simulated vehicle functionality feature may refer to "computer-generating", "simulating" and/or "modelling" a simulated vehicle functionality feature, whereas vehicle "functionality feature" may refer to vehicle "characteristics" and further to merely vehicle "feature" and/or vehicle "functionality". According to an example, "determining" a simulated vehicle functionality feature may refer to "determining logic, design, graphics, aesthetics, geometries and/or functionality of" a simulated vehicle functionality feature. The expression that the simulated vehicle functionality feature "comprises" may refer to that the simulated vehicle functionality feature "is represented by", whereas light "characteristics" may refer to light "position(s)", "positioning", "function(s)", "ambience" and/or "appearance".

Optionally, the vehicle feature evaluation system may determine a simulated object feature to be evaluated in the road-driven vehicle. Providing to the HMD display may then further comprise additionally providing in real-time to the HMD display of the HMD, taking into consideration the HMD orientation, a virtual representation of the simulated object feature superimposed on the real-time surrounding-showing video stream. The simulated object feature may e.g. comprise a simulated other vehicle, a simulated road user, and/or a simulated moving or fixed obstacle. Thereby, there is defined—e.g. computer-generated—a virtual object of interest to validate in a real vehicle. Furthermore, thereby, the virtual representation of the simulated object feature is overlaid the real-world video stream to be temporally and spatially commensurate with the video stream such that said video stream appears as a background overlaid with—in addition to the virtual design feature representation—said virtual object feature representation. Accordingly, upon in real-time superimposing a virtual representation of a simulated object feature—such as for instance a virtual pedestrian appearing to cross the road in front of the road-driven vehicle—on the surrounding-showing video stream, said simulated object feature and/or an effect it has on the HMD-wearing occupant—who for instance may be the driver of the road-driven vehicle—may be evaluated, e.g. while said road-driven vehicle is driven in real traffic and/or along actual roads. Consequently, the simulated object feature—and/or an effect it has on the HMD-wearing occupant—may be evaluated in real traffic and/or in real road-driving scenarios, which thus enables said simulated object feature and/or the effect it has on the HMD-wearing occupant to be evaluated under more reality-resembling conditions and/or in a more reality-resembling environment than should said evaluation be performed in e.g. a commonly known static or dynamic rig displaying the environment and traffic on large scale screens in front of a vehicle mock-up. Should the simulated object feature comprise a simulated other vehicle, e.g. appearing to drive in front of the road-driven vehicle, then a virtual vehicle may be evaluated in the road-driven vehicle, such as e.g. graphics thereof and/or new and/or updated design thereof, and/or an effect it has on the HMD-wearing occupant. On the other hand, should the simulated object feature additionally or alternatively comprise a simulated road user, e.g. appearing to cross the road in front of the road-driven vehicle, then a virtual road user—and/or an effect it has on the HMD-wearing occupant—may be evaluated in the road-driven vehicle. Moreover, should the simulated object feature additionally or alternatively comprise a simulated moving or fixed obstacle, e.g. an elk appearing to e.g. be standing on or crossing the road in front of the road-driven vehicle, then a virtual moving or fixed obstacle—and/or an effect it has on the HMD-wearing occupant—may be evaluated in the road-driven vehicle. "Determining" a simulated object feature may refer to "computer-generating", "simulating" and/or "modelling" a simulated object feature, whereas "object" may refer to "physical object", "exterior object" and/or "object exterior of the road-driven vehicle". "Object feature" may further refer to merely "object" According to an example, "determining" a simulated object feature may refer to "determining logic, design, graphics, aesthetics, geometries and/or functionality of" a simulated object feature, whereas the expression that the simulated object feature "comprises" may refer to that the simulated object feature "is represented by". "Other vehicle" may refer to "a vehicle" and/or "road-driven vehicle", whereas "road user" may indicate anyone who uses a road such as e.g. a pedestrian, cyclist, motorist etc.

Optionally, the vehicle feature evaluation system may determine a fictive location of the simulated design feature relative the road-driven vehicle. The above discussed providing of the virtual design feature representation taking into consideration the HMD orientation may then comprise providing the virtual design feature representation superimposed on the real-time surrounding-showing video stream such that positioning of the virtual design feature representation corresponds to the fictive design feature location. Thereby, it is provided that the positioning of the overlaid virtual design feature representation on the real-world video stream spatially commensurate with the intended fictive vehicle location of the vehicle design feature to be simulated. The fictive design feature location may be arbitrarily selected as deemed relevant for the implementation at hand, and may further be of any arbitrary form, size and/or dimensions ranging from a few millimetres to hundreds or even thousands of millimetres across. Additionally or alternatively, optionally, the vehicle feature evaluation system may determine a fictive location of the simulated vehicle functionality feature relative the road-driven vehicle. The above discussed optional providing of the virtual functionality feature representation taking into consideration the HMD orientation may then comprise providing the virtual functionality feature representation superimposed on the real-time surrounding-showing video stream such that positioning of the virtual functionality feature representation corresponds to the fictive functionality feature location. Thereby, it is provided that the positioning of the overlaid virtual functionality feature representation on the real-world video stream spatially commensurate with the intended fictive vehicle location of the vehicle functionality feature to be simulated. The fictive functionality feature location may be arbitrarily selected as deemed relevant for the implementation at hand, and may further be of any arbitrary form, size and/or dimensions ranging from a few millimetres up to hundreds or even thousands of millimetres across. Additionally or alternatively, optionally, the vehicle feature evaluation system may determine a fictive location of the simulated object feature relative the road-driven vehicle. The above discussed optional providing of the virtual object feature representation taking into consideration the HMD orientation may then comprise providing the virtual object feature representation superimposed on the real-time surrounding-showing video stream such that positioning of the virtual object feature representation corresponds to the fictive object feature location. Thereby, it is provided that the positioning of the overlaid virtual object feature representation on the real-world video stream spatially commensurate with the intended fictive location of the object feature to be simulated. The fictive object feature location may be arbitrarily selected as deemed relevant for the implementation at hand and may further for instance refer to a location outside the road-driven vehicle, such as e.g. in front of the road-driven vehicle, e.g. a few millimetres therefrom up to many thousands of millimetres therefrom. "Determining" a fictive location may refer to "mapping" a fictive location, whereas "fictive" location may refer to "intended" and/or "virtual" location. Fictive "location", on the other hand, may refer to fictive "position" and/or "placement", whereas "relative" the road-driven vehicle may refer to "in relation to" and/or "within" the road-driven vehicle. "Corresponds to" the fictive location may refer to "commensurate with", "reflects" and/or "represents" the fictive location.

Optionally, the vehicle feature evaluation system may further comprise updating the virtual functionality feature representation based on a user interaction with the simulated vehicle functionality feature. Thereby, interaction by a user with the simulated vehicle functionality feature may result in that the virtual representation of the simulated vehicle functionality feature is updated in accordance with said interaction. That is, user interaction with the simulated vehicle functionality feature, which feature for instance is represented by selectable options available on a simulated vehicle display, may result in that a user selected option is carried out and/or updated in accordance with the user interaction, which subsequently is reflected by the corresponding virtual functionality feature being updated in accordance therewith. The user interaction may be based on detection, by means of one or more user interaction sensors, of a user in and/or at the fictive functionality feature location. Thereby, presence of a user, e.g. the HMD-wearing occupant, and/or e.g. a finger of said user/occupant, may be sensed in or at the position in the vehicle representing the location of the simulated vehicle functionality feature, whereby the virtual representation of the simulated vehicle functionality feature subsequently may be updated in accordance with said presence, and/or in accordance with the geographical position and/or the nature of said presence. User interaction may be detected in any arbitrary manner known in the art, e.g. by means of one or more user interaction sensors and/or a user interaction determining system, for instance comprising touch sensor(s), camera(s) and/or position detection sensor(s) worn by the user e.g. on his/her hand and/or finger. The expression "updating" the virtual functionality feature representation may refer to "updating content, graphical data and/or geometric data of" the virtual functionality feature representation, whereas "based on a" user interaction may refer to "as a result of" user interaction and/or "based on input data and/or one or more signals derived from" user interaction. "User interaction", on the other hand, may refer to "occupant interaction". The expression detection "by means of" one or more user interaction sensors may refer to detection "with support from" and/or "with input from" one or more user interaction sensors. Detection "of a user", on the other hand, may refer to detection "of the occupant", and further to detection "of a hand and/or one or more fingers of a user". The expression "in and/or at" the fictive functionality feature location may refer to "in or at a location within the vehicle representing" the fictive functionality feature location.

Additionally or alternatively, optionally, the vehicle feature evaluation system may further comprise updating the virtual functionality feature representation based on a vehicle signal affecting the simulated vehicle functionality feature, derived from the road-driven vehicle. Thereby, deriving a vehicle signal which affects the simulated vehicle functionality feature—e.g. resulting from manoeuvring of and/or user interaction with the road-driven vehicle—results in that the virtual representation of the simulated vehicle functionality feature is updated in accordance therewith. That is, deriving—from the road-driven vehicle—a vehicle signal affecting the simulated vehicle functionality feature, where the vehicle signal for instance comprises vehicle data such as e.g. fuel consumption and where the simulated vehicle functionality feature for instance is represented by a simulated vehicle display showing said vehicle data e.g. fuel consumption, may result in that the virtual functionality feature—in this example the virtual vehicle display—is updated in accordance with said vehicle signal, i.e. the fuel consumption value shown on the virtual display is updated along with the received vehicle signal comprising an updated fuel consumption value. The vehicle signal may be derived from the road-driven vehicle in any arbitrary known manner, for instance via wired and/or wireless communication therewith, and/or with support from a vehicle signal determining system and/or unit adapted for determining which input derived from the road-driven vehicle affects the simulated vehicle functionality feature. The expression "updating" the virtual functionality feature representation may refer to "updating content, graphical data and/or geometric data of" the virtual functionality feature representation, whereas "based on a" vehicle signal may refer to "based on input and/or data from a" vehicle signal. "Derived from" the road-driven vehicle, on the other hand, may refer to "received from" the road-driven vehicle. According to an example, "updating the virtual functionality feature representation based on a vehicle signal affecting the simulated vehicle functionality feature, derived from the road-driven vehicle" may refer to "updating the virtual functionality feature representation based on a vehicle signal derived from the road-driven vehicle, which vehicle signal is based on a manoeuvring of and/or user interaction with the road-driven vehicle affecting the simulated vehicle functionality feature".

Optionally, the vehicle feature evaluation system may update the real-time video stream, the superimposed virtual design feature representation, the superimposed virtual functionality feature representation and/or the superimposed virtual object feature representation based on updated captured image data and/or based on updated determined HMD orientation. Thereby, it is provided that the real-time video stream and/or the virtual representation(s) are continuously updated to reflect updated captured image data and/or updated orientation of the HMD. "Updating" may refer to "continuously and/or intermittently updating".

According to a second aspect of embodiments herein, the object is achieved by a vehicle feature evaluation system for—and/or adapted for—enabling evaluation of a simulated vehicle-related feature. The vehicle feature evaluation system comprises a HMD orientation determining unit for—and/or adapted for—determining in relation to a road-driven vehicle, with support from a tracking system, an orientation of a head-mounted display, HMD, adapted to be worn by an occupant on-board the road-driven vehicle. The vehicle feature evaluation system further comprises a design feature determining unit for—and/or adapted for—determining a simulated vehicle design feature to be evaluated in the road-driven vehicle. Moreover, the vehicle feature evaluation system comprises a HMD providing unit for—and/or adapted for—providing in real-time to a HMD display of the HMD, taking into consideration the HMD orientation, a virtual representation of the simulated vehicle design feature superimposed on a real-time surrounding-showing video stream derived from real-world image data captured with support from one or more vehicle-attached cameras adapted to capture surroundings external to the road-driven vehicle.

Optionally, the simulated vehicle design feature may comprise a simulated vehicle interior section and/or a simulated vehicle exterior section.

Optionally, the vehicle feature evaluation system may comprise a functionality feature determining unit. The HMD providing unit may then be adapted for additionally providing in real-time to the HMD display of the HMD, taking into consideration the HMD orientation, a virtual representation of the simulated vehicle functionality feature superimposed on the real-time surrounding-showing video stream. The simulated vehicle functionality feature may e.g. comprise a simulated vehicle human machine interface, HMI, a simulated vehicle display, a simulated vehicle head-up display, HUD, light characteristics, and/or a simulated effect resulting from a simulation of the simulated vehicle functionality feature.

Optionally, the vehicle feature evaluation system may comprise an object feature determining unit. The HMD providing unit may then be adapted for additionally providing in real-time to the HMD display of the HMD, taking into consideration the HMD orientation, a virtual representation of the simulated object feature superimposed on the real-time surrounding-showing video stream. The simulated object feature may e.g. comprise a simulated other vehicle, a simulated road user, and/or a simulated moving or fixed obstacle.

Optionally, the vehicle feature evaluation system may further comprise a location determining unit for—and/or adapted for—determining a fictive design feature location of the simulated vehicle design feature relative the road-driven vehicle. The HMD providing unit may then be further adapted for providing the virtual design feature representation superimposed on the real-time surrounding-showing video stream such that positioning of the virtual design feature representation corresponds to the fictive design feature location. Additionally or alternatively, the optional location determining unit may be for—and/or adapted for—determining a fictive functionality feature location of the simulated vehicle functionality feature relative the road-driven vehicle. The HMD providing unit may then be further adapted for providing the virtual functionality feature representation superimposed on the real-time surrounding-showing video stream such that positioning of the virtual functionality feature representation corresponds to the fictive functionality feature location. Additionally or alternatively, the optional location determining unit may be for—and/or adapted for—determining a fictive object feature location of the simulated object feature relative the road-driven vehicle. The HMD providing unit may then be further adapted for providing the virtual object feature representation superimposed on the real-time surrounding-showing video stream such that positioning of the virtual object feature representation corresponds to the fictive object feature location.

Optionally, the vehicle feature evaluation system may further comprise a user interaction updating unit for—and/or adapted for—updating the virtual functionality feature representation based on a user interaction with the simulated vehicle functionality feature. The user interaction may be based on detection, by means of one or more user interaction sensors, of a user in and/or at the fictive functionality feature location. Additionally or alternatively, optionally, the vehicle feature evaluation system may further comprise a vehicle signal updating unit for—and/or adapted for—updating the virtual functionality feature representation based on a vehicle signal affecting the simulated vehicle functionality feature, derived from the road-driven vehicle.

Optionally, the vehicle feature evaluation system may further comprise a continuous updating unit for—and/or adapted for—updating the real-time video stream, the superimposed virtual design feature representation, the superimposed virtual functionality feature representation and/or the superimposed virtual object feature representation based on updated captured image data and/or based on updated determined HMD orientation.

Similar advantages as those mentioned in the foregoing in relation to the first aspect correspondingly apply to the second aspect, and are not further discussed.

According to a third aspect of embodiments herein, the object is achieved by a vehicle—e.g. a road-driven vehicle—comprising a vehicle feature evaluation system as discussed above. Again, similar advantages as those mentioned in the foregoing in relation to the first aspect correspondingly apply to the third aspect, and are not further discussed.

According to a fourth aspect of embodiments herein, the object is achieved by a computer program product comprising a computer program containing computer program code means arranged to cause a computer or a processor to execute the steps of the vehicle feature evaluation system discussed in the foregoing, stored on a computer-readable medium or a carrier wave. Yet again, similar advantages as those mentioned in the foregoing in relation to the first aspect correspondingly apply to the fourth aspect, and are not further discussed.

BRIEF DESCRIPTION OF THE DRAWINGS

The various aspects of the non-limiting embodiments, including particular features and advantages, will be readily understood from the following detailed description and the accompanying drawings, in which.

DETAILED DESCRIPTION

Figure 1:
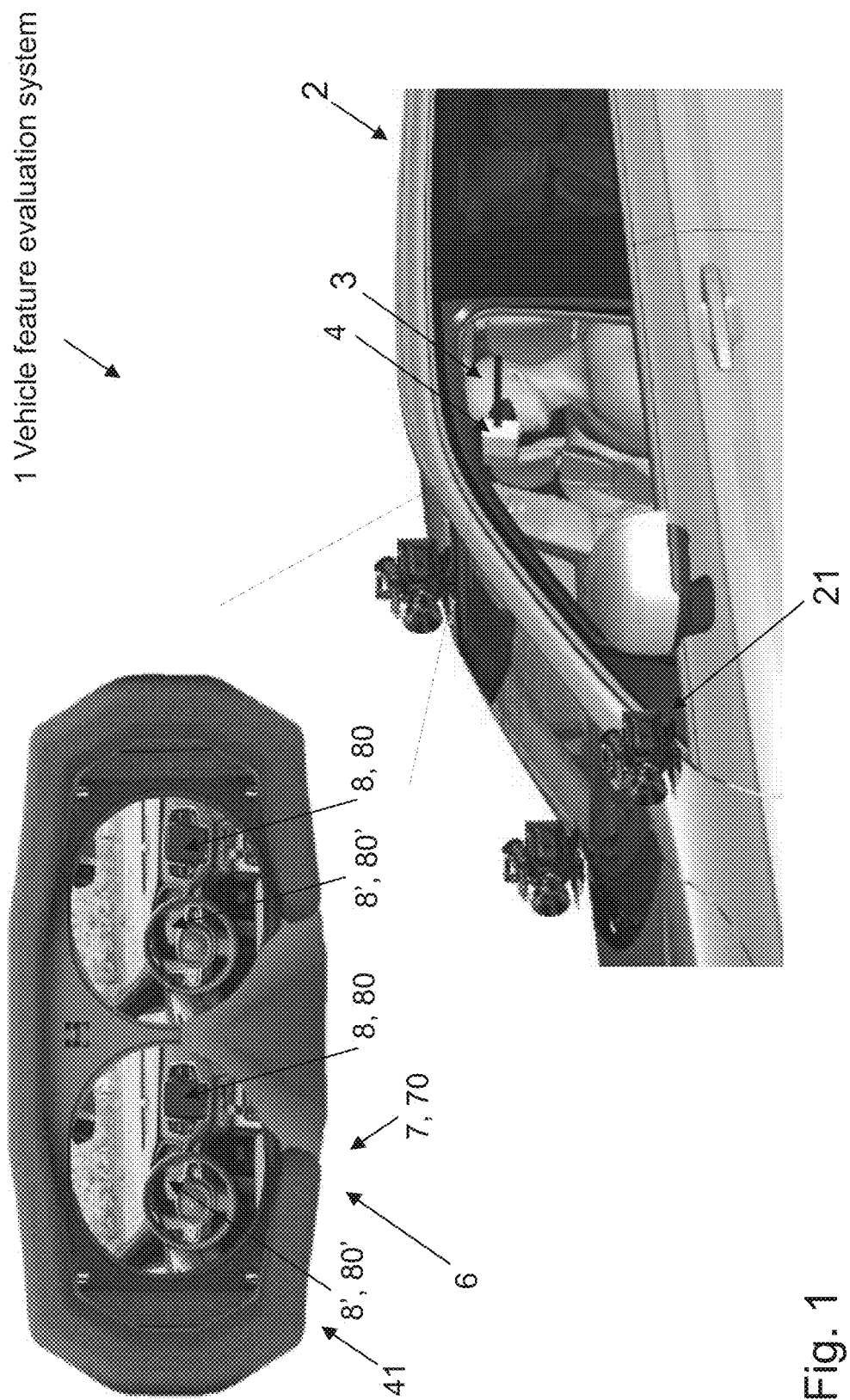
FIG. 1 illustrates a schematic view of an exemplifying vehicle feature evaluation system according to embodiments of the disclosure.

Non-limiting embodiments of the present disclosure will now be described more fully hereinafter with reference to the accompanying drawings, in which currently preferred embodiments of the disclosure are shown. This disclosure may, however, be embodied in many different forms and should not be construed as limited to the embodiments set forth herein. Like reference characters refer to like elements throughout. Dashed lines of some boxes in the figures indicate that these units or actions are optional and not mandatory. In the following, according to embodiments herein which relate to enabling evaluation of a simulated vehicle-related feature, there will be disclosed an approach which enables a virtual version of a feature related to and/or associated with a vehicle to be evaluated without a need to build a physical mock-up for evaluation.

Figure 2:
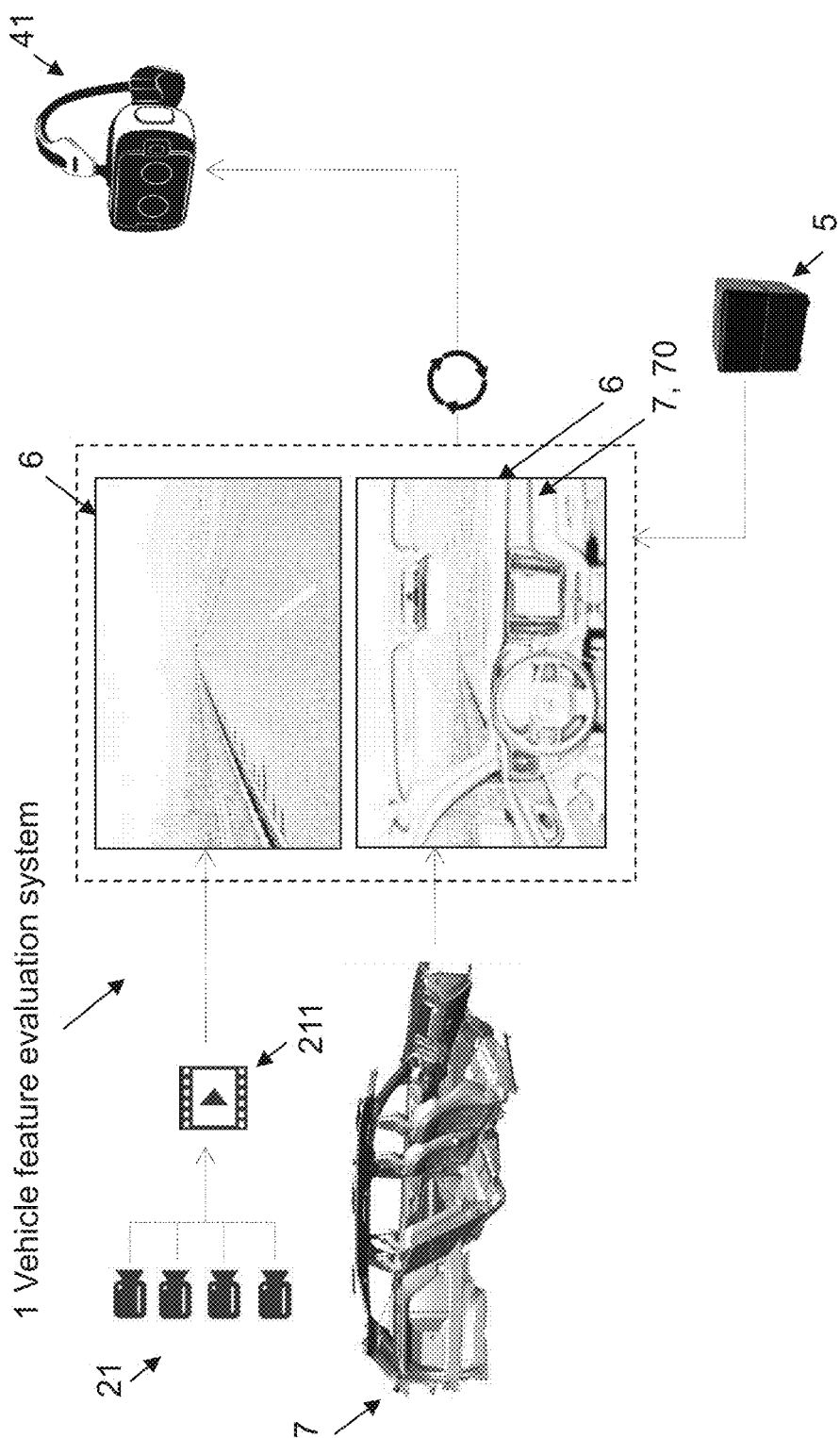
FIG. 2 illustrates a schematic view of the vehicle feature evaluation system of FIG. 1 in greater detail.
Figure 3:
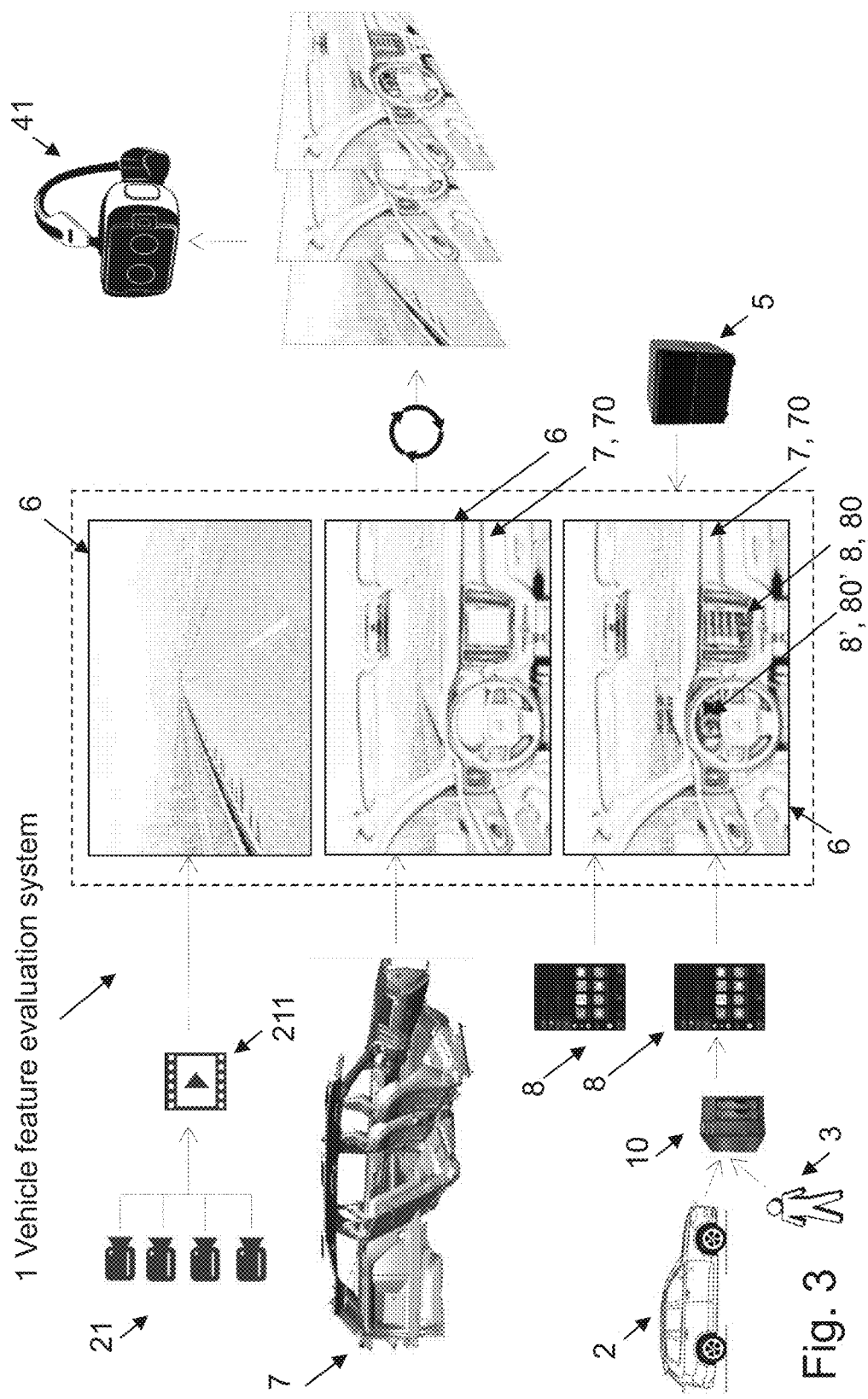
FIG. 3 illustrates a schematic view of the vehicle feature evaluation system of FIG. 1 in yet further greater detail.

Referring now to the figures and FIGS. 1-3 in particular, there is depicted a schematic view of an exemplifying vehicle feature evaluation system 1 according to embodiments of the disclosure. The vehicle feature evaluation system 1 is here comprised in a road-driven vehicle 2, namely an exemplifying a passenger car. Provided on the road-driven vehicle 2 are one or more vehicle-attached cameras 21—here three essentially forward-facing cameras 21—adapted to capture surroundings external of the road-driven vehicle 2. On-board said vehicle 2 is an occupant 3, wearing an HMD 4, the orientation of which—in relation to the vehicle 2—may be determined with support from a tracking system 5 (shown in FIGS. 2-3). The HMD 4 comprises at least one HMD display 41, here two displays, on which it is displayed a real-time surrounding-showing video stream 6 derived from real-world image data 211 (shown in FIGS. 2-3) captured with support from the one or more vehicle-attached cameras 21. Superimposed on said video stream 6 is a virtual representation 7 of a simulated vehicle design feature to be evaluated in the road-driven vehicle 2. The simulated vehicle design feature here comprises an exemplifying simulated vehicle interior section, at least comprising a simulated dashboard and steering wheel, and the virtual representation 7 is accordingly here represented by a virtual interior section comprising an exemplifying virtual dashboard and virtual steering wheel. The simulated vehicle design feature may have a fictive design feature location 70 relative the vehicle 2, and for the exemplifying simulated vehicle interior section in FIGS. 1-3, the fictive design feature location 70 is in an exemplifying manner essentially situated where the—to the HMD-wearing occupant 3 invisible—dashboard and steering wheel of the road-driven vehicle 2 are situated. According to other embodiments, a simulated vehicle design feature may additionally or alternatively optionally comprise a simulated vehicle exterior section. Superimposed on the surrounding-showing video stream 6 is additionally an optional virtual representation 8 of a simulated vehicle functionality feature to be evaluated in the road-driven vehicle 2. The simulated vehicle functionality feature here comprises an exemplifying simulated vehicle display, more specifically a simulated infotainment display, and the virtual functionality feature representation 8 is accordingly here represented by a virtual infotainment display. The simulated vehicle functionality feature may have a fictive functionality feature location 80 relative the vehicle 2, and for the exemplifying simulated infotainment display in FIGS. 1-3, the fictive functionality feature location 80 is in an exemplifying manner essentially centered on a dashboard of the road-driven vehicle 2 and/or essentially centered on the virtual dashboard 7. Additionally depicted is an exemplifying alternative virtual functionality feature representation 8' of an alternative simulated vehicle functionality feature. The alternative simulated vehicle functionality feature here comprises an optional exemplifying simulated driver information display, and the alternative virtual representation 8' is then accordingly represented by an exemplifying virtual driver information display. The simulated driver information display here has an exemplifying fictive functionality feature location 80' on the vehicle dashboard of the road-driven vehicle 2 and/or on the virtual dashboard 7, in front of a driver's seat of the road-driven vehicle 2. According to other embodiments, a simulated vehicle functionality feature may additionally or alternatively optionally comprise e.g. a simulated vehicle HMI, a simulated HUD, simulated light characteristics and/or a simulated effect resulting from a simulation of the simulated vehicle functionality feature. Additionally shown in FIG. 3 is an optional server 10, which will be described in greater detail in conjunction with FIG. 5.

Figure 4:
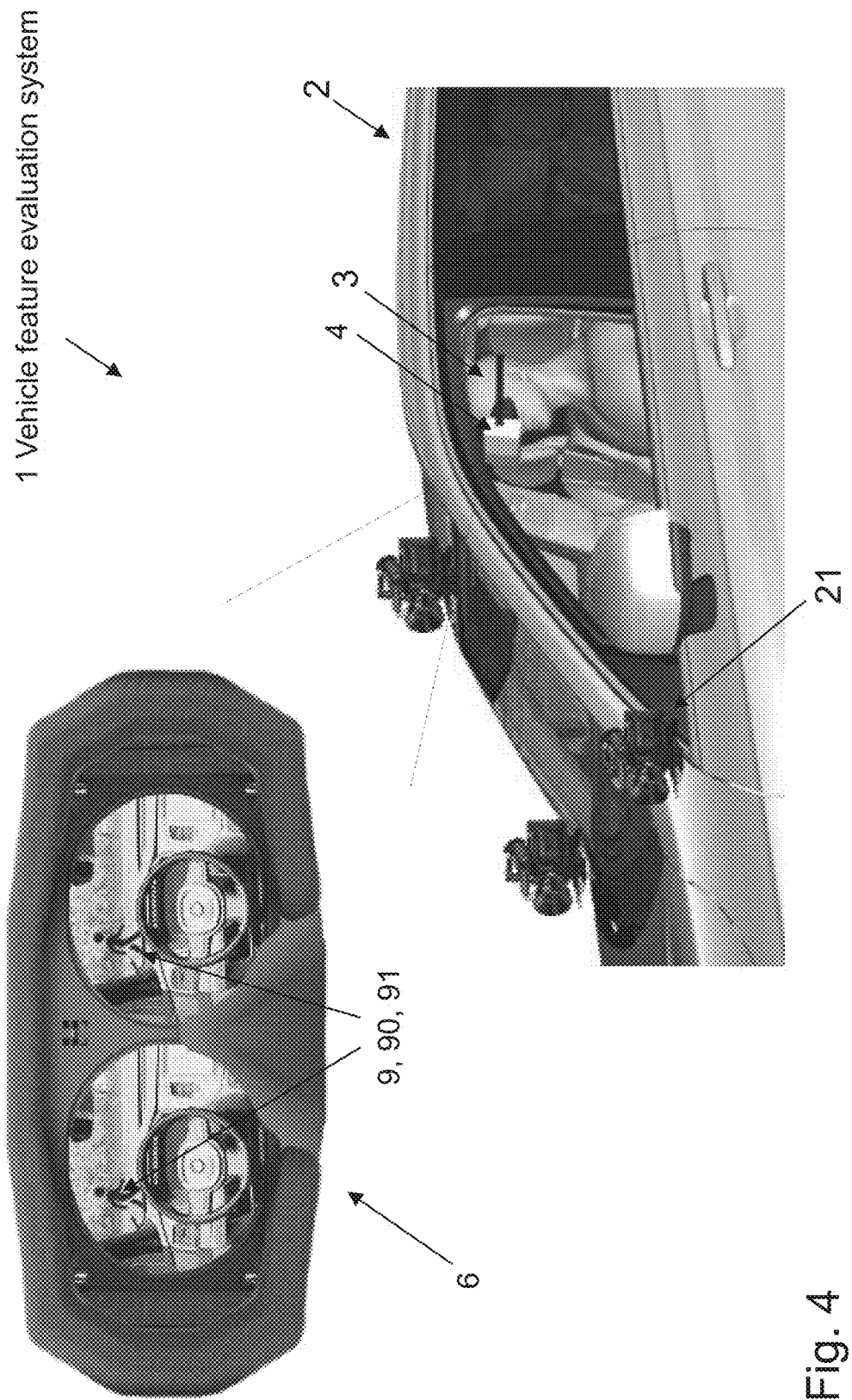
FIG. 4 illustrates a schematic view of an alternative vehicle feature evaluation system according to embodiments of the disclosure.

FIG. 4. illustrates a schematic view of an alternative vehicle feature evaluation system 1 according to embodiments of the disclosure. Superimposed on the surrounding-showing video stream 6 is here additionally an optional virtual representation 9 of a simulated object feature to be evaluated in the road-driven vehicle 2. The simulated object feature here comprises an exemplifying simulated road user, namely a pedestrian, and the virtual object feature representation 9 is accordingly here represented by a virtual road user 91, namely a virtual pedestrian, in an exemplifying manner crossing the street in front of the road-driven vehicle 2. The simulated object feature may have a fictive object feature location 90 relative the vehicle 2, and for the exemplifying simulated pedestrian in FIG. 4, the fictive object feature location 90 is in an exemplifying manner essentially a few meters in front of the road-driven vehicle 2. According to other embodiments, a simulated object feature may additionally or alternatively optionally e.g. comprise a simulated other vehicle and/or a simulated moving or fixed obstacle.

Figure 5:
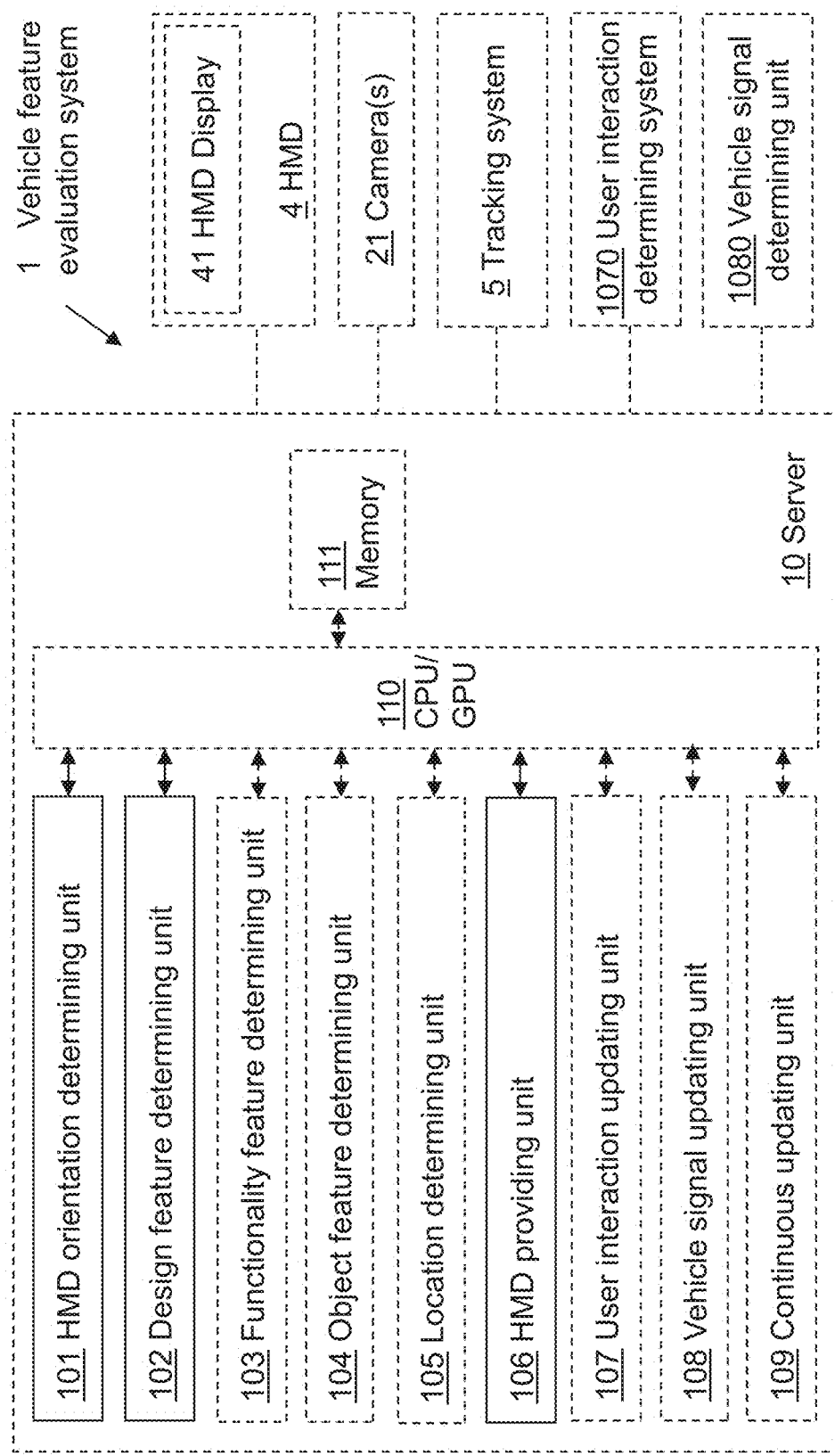
FIG. 5 is a schematic block diagram illustrating an exemplifying vehicle feature evaluation system according to embodiments of the disclosure.
Figure 6:
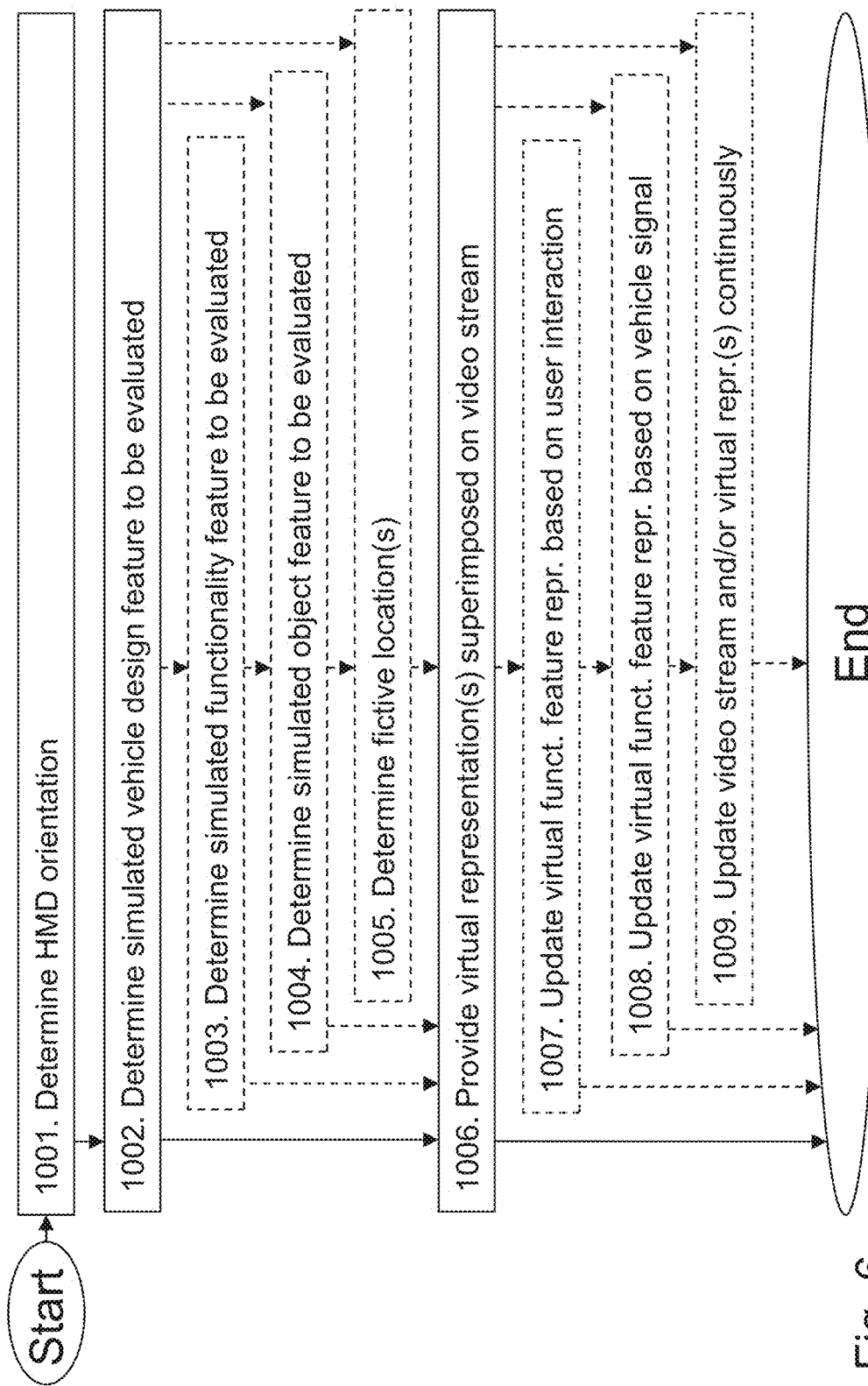
FIG. 6 is a flowchart depicting an exemplifying method performed by a vehicle feature evaluation system according to embodiments of the disclosure.

As further shown in FIG. 5, which is a schematic block diagram illustrating an exemplifying vehicle feature evaluation system 1 according to embodiments of the disclosure, the vehicle feature evaluation system 1 comprises a HMD orientation determining unit 101, a design feature determining unit 102, an optional functionality feature determining unit 103, an optional object feature determining unit 104, an optional location determining unit 105, a HMD providing unit 106, an optional user interaction updating unit 107, an optional vehicle signal updating unit 108, and an optional continuous updating unit 109, all of which will be described in greater detail in conjunction with FIG. 6. Furthermore, the embodiments herein for enabling evaluation of a simulated vehicle-related feature, may be implemented through one or more processors, such as a processor 110, here denoted CPU/GPU, together with computer program code for performing the functions and actions of the embodiments herein. Said program code may also be provided as a computer program product, for instance in the form of a data carrier carrying computer program code for performing the embodiments herein when being loaded into the vehicle feature evaluation system 1. One such carrier may be in the form of a CD ROM disc and/or a hard drive. It is however feasible with other data carriers such as a memory stick. The computer program code may furthermore be provided as pure program code on a server and downloaded to the vehicle feature evaluation system 1. The vehicle feature evaluation system 1 may further comprise a memory 111 comprising one or more memory units. The memory 111 may be arranged to be used to store e.g. information, and further to store data, configurations, schedulings, and applications, to perform the methods herein when being executed in the vehicle feature evaluation system 1. For instance, the computer program code may be implemented in the firmware, stored in FLASH memory 111, of an embedded processor 110, and/or downloaded from online. Furthermore, said units 101, 102, 103, 104, 105, 106, 107, 108, and/or 109 described above, the optional processor 110 and/or the optional memory 111, may at least partly be comprised in the server 10, which server 10 may be comprised in and/or carried onboard the road-driven vehicle 2. Those skilled in the art will also appreciate that said units 101, 102, 103, 104, 105, 106, 107, 108, and/or 109 described above, and which will be described in more detail later on in this description, may refer to a combination of analog and digital circuits, and/or one or more processors configured with software and/or firmware, e.g. stored in a memory such as the memory 111, that when executed by the one or more processors such as the processor 110 perform as will be described in more detail in conjunction with FIG. 6. One or more of these processors, as well as the other digital hardware, may be included in a single ASIC (Application-Specific Integrated Circuitry), or several processors and various digital hardware may be distributed among several separate components, whether individually packaged or assembled into a SoC (System-on-a-Chip). Further shown in FIG. 5 is an exemplifying optional user interaction determining system 1070, adapted for determining user interaction by a user e.g. the occupant 3 with the simulated vehicle functionality feature—here the exemplifying simulated vehicle infotainment display. The user interaction determining system 1070 may for instance comprise touch sensor(s), camera(s) and/or position detection sensor(s) worn by the user e.g. on his/her hand and/or finger. Also depicted is an exemplifying optional vehicle signal determining unit 1080, adapted for determining which input derived from the road-driven vehicle 2 affects the simulated vehicle functionality feature—here the exemplifying simulated vehicle infotainment display—e.g. during manoeuvring of said vehicle 2.

FIG. 6 is a flowchart depicting an exemplifying method performed by a vehicle feature evaluation system 1 according to embodiments of the disclosure. Said method is for enabling evaluation of a simulated vehicle-related feature. The exemplifying method, which may be continuously repeated, comprises the following actions discussed with support from FIGS. 1-5.

Action 1001

In Action 1001, the vehicle feature evaluation system 1 determines in relation to the road-driven vehicle 2—e.g. by means of the HMD orientation determining unit 101—with support from the tracking system 5, an orientation of the HMD 4 adapted to be worn by the occupant 3 on-board the road-driven vehicle 2. Thus, as shown with support from at least FIGS. 1, 2, 3 and 5, there is established a position and/or location of an occupant-worn HMD 4 in view of a real vehicle 2 e.g. adapted to and/or intended to be driven outdoors such as in real traffic and/or along actual roads.

Action 1002

In Action 1002, the vehicle feature evaluation system 1 determines—e.g. by means of the design feature determining unit 102—a simulated vehicle design feature to be evaluated in the road-driven vehicle 2. Thus, as shown with support from at least FIGS. 1, 2, 3 and 5, there is defined, e.g. computer-generated, a virtual vehicle design feature—optionally a simulated interior section e.g. comprising at least a simulated dashboard and a simulated steering wheel—of interest to validate in a real vehicle 2. Thereby, the virtual interior section 7—here the virtual interior section and/or virtual steering wheel—may be evaluated in the road-driven vehicle 2, such as e.g. new and/or updated design, colour, material and/or user interface thereof and/or e.g. geometrics for instance CAD and/or DSM geometrics thereof. Optionally, additionally or alternatively, the simulated vehicle design feature may comprise a simulated vehicle exterior section.

Action 1003

In optional Action 1003, the vehicle feature evaluation system 1 may determine—e.g. by means of the functionality feature determining unit 103—a simulated vehicle functionality feature to be evaluated in the road-driven vehicle 2. Thus, as shown with support from at least FIGS. 1, 2, 3 and 5, there is defined, e.g. computer-generated, a virtual vehicle functionality feature—optionally a simulated vehicle infotainment display—of interest to validate in a real vehicle 2. Thereby, the virtual functionality feature 7—here the virtual infotainment display 7—may be evaluated in the road-driven vehicle 2, such as e.g. graphics thereof and/or new and/or updated functionality and/or design thereof. Optionally, additionally or alternatively, the simulated vehicle functionality feature may comprise a simulated vehicle human machine interface, HMI, a simulated vehicle head-up display, HUD, simulated light characteristics, and/or a simulated effect resulting from a simulation of the simulated vehicle functionality feature.

Action 1004

In optional Action 1004, the vehicle feature evaluation system 1 may determine—e.g. by means of the object feature determining unit 104—a simulated object feature to be evaluated in the road-driven vehicle 2. Thus, as shown with support from FIG. 4 and further from FIGS. 1, 2, 3 and 5, there is defined, e.g. computer-generated, a virtual object feature 9—optionally a simulated road user 91—of interest to validate in a real vehicle 2. Thereby, a virtual road user 9—and/or an effect it has on the HMD-wearing occupant 3—may be evaluated in the road-driven vehicle 2. Optionally, additionally or alternatively, the simulated object feature may comprise a simulated other vehicle, and/or a simulated moving or fixed obstacle.

Action 1005

In optional Action 1005, the vehicle feature evaluation system 1 may determine—e.g. by means of the location determining unit 105—a fictive design feature location 70 of the simulated vehicle design feature relative the road-driven vehicle 2. Thus, as shown with support from at least FIGS. 1, 2, 3 and 5, the fictive design feature location 70 of the simulated vehicle design feature—optionally the simulated interior section—may be determined to have a location in relation to the vehicle 2, e.g. in the case of the simulated dashboard and/or simulated steering wheel be located for instance where the—to the HMD-wearing occupant 3 invisible—dashboard and steering wheel of the road-driven vehicle 2 are situated.

Should optional Action 1005 discussed above be preceded by Action 1003 of determining a fictive functionality feature location, then may in optional Action 1005 the vehicle feature evaluation system 1, additionally or alternatively, determine—e.g. by means of the location determining unit 105—a fictive functionality feature location 80 of the simulated vehicle functionality feature relative the road-driven vehicle 2. Thus, as shown with support from at least FIGS. 1, 2, 3 and 5, the fictive functionality feature location 80 of the simulated vehicle functionality feature—optionally the simulated vehicle display—may be determined to have a location in relation to the vehicle 2, e.g. in the case of the simulated infotainment display be located essentially centered on the dashboard of the road-driven vehicle 2 and/or essentially centered on the virtual dashboard 7.

Should optional Action 1005 discussed above be preceded by Action 1004 of determining a fictive object feature location, then may in optional Action 1005 the vehicle feature evaluation system 1, additionally or alternatively, determine—e.g. by means of the location determining unit 105—a fictive object feature location 90 of the simulated object feature relative the road-driven vehicle 2. Thus, as shown with support from FIG. 4 and further from FIGS. 1, 2, 3 and 5, the fictive object feature location 90 of the simulated vehicle object feature—optionally the simulated road user—may be determined to have a location in relation to the vehicle 2, e.g. in the case of the simulated pedestrian be located essentially a few meters in front of the road-driven vehicle 2.

Action 1006

In Action 1006, the vehicle feature evaluation system 1 provides in real-time to the HMD display 41—e.g. by means of the HMD providing unit 106—taking into consideration the HMD orientation, the virtual representation 7 of the simulated vehicle design feature superimposed on the real-time surrounding-showing video stream 6 derived from real-world image data 211 captured with support from the one or more surrounding-capturing cameras 21 adapted to capture surroundings external of the road-driven vehicle 2. Thus, as shown with support from at least FIGS. 1, 2, 3 and 5, there is provided to the HMD display 41 a real-time physical world view 6 of surroundings external the road-driven vehicle 2—essentially as captured by the vehicle-attached camera(s) 21—electronically mixed with the computer-generated virtual design feature representation 7 temporally and spatially commensurate with said physical world view 6 such that the surrounding-showing video stream 6 appears as a background overlaid with said virtual design feature representation 7. That is, with the vehicle-attached camera(s) 21 provided to capture surroundings external of the road-driven vehicle 2, the real-time surrounding-showing video stream 6 shows surroundings and/or an environment exterior of the vehicle 2, hence excluding interior—and potentially at least partial exterior—views of said road-driven vehicle 2. Subsequently, with the HMD-wearing occupant 3 being on-board the road-driven vehicle 2—e.g. seated in a driver's seat or passenger's seat thereof—and with the HMD orientation being taken into consideration—provided to the HMD display 41 is then a portion of surrounding-showing video stream 6—derived from real-world image data 211 captured with support from the vehicle-attached camera(s) 21—corresponding to and/or spatially commensurate with a field of view of the HMD-wearing occupant 3. The HMD-wearing occupant 3 would accordingly be shown—on the HMD display(s) 41—a physical world view spatially commensurate with said occupant's field of view, but from which physical world view an interior—and potentially at least a portion of an exterior—of the road-driven vehicle 2 would be excluded due to the vehicle-attached camera(s) 21 capturing surroundings external of—not internal of—the road-driven vehicle 2. Thus, the real-time surrounding-showing video stream 6 may then represent what a driver or passenger of said road-driven vehicle 2 would essentially see even if not wearing the HMD 4, but with interior portions of the road-driven vehicle 2 removed. Accordingly, with the interior—and potentially at least partial exterior—of the road-driven vehicle 2 essentially wiped out from the HMD-wearing occupant's 3 physical world view, one or more simulated design features—e.g. represented by a simulated updated and/or new interior or exterior or a portion thereof—may be evaluated in its place.

Optionally, should Action 1006 discussed above be preceded by optional Action 1003 of determining a simulated vehicle functionality feature to be evaluated, then Action 1006 may comprise additionally providing in real-time to the HMD display 41, taking into consideration the HMD orientation, a virtual representation 8 of the simulated vehicle functionality feature superimposed on the real-time surrounding-showing video stream 6. The simulated vehicle functionality feature may e.g. comprise a simulated vehicle human machine interface, HMI, a simulated vehicle display, a simulated vehicle head-up display, HUD, simulated light characteristics, and/or a simulated effect resulting from a simulation of the simulated vehicle functionality feature. Thus, as shown with support from at least FIGS. 1, 2, 3 and 5, the virtual representation 8 of the simulated vehicle functionality feature is overlaid the real-world video stream 6 to be temporally and spatially commensurate with the video stream 6 such that said video stream 6 appears as a background overlaid with—in addition to the virtual design feature representation 7—said virtual functionality feature representation 8. Accordingly, upon in real-time superimposing a virtual representation 8 of a simulated vehicle functionality feature—such as for instance a virtual display with e.g. new and/or updated design and/or functionality—on the surrounding-showing video stream 6, said simulated vehicle functionality feature may be evaluated in the road-driven vehicle 2, e.g. while said road-driven vehicle 2 is driven in real traffic and/or along actual roads. Consequently, the simulated vehicle functionality feature may be evaluated in real traffic and/or in real road-driving scenarios, which thus enables said simulated vehicle functionality feature to be evaluated under more reality-resembling conditions and/or in a more reality-resembling environment than should said evaluation be performed in e.g. a commonly known static or dynamic rig displaying the environment and traffic on large scale screens in front of a vehicle mock-up.

Optionally, should Action 1006 discussed above be preceded by optional Action 1004 of determining a simulated object feature to be evaluated, then Action 1006 may comprise additionally providing in real-time to the HMD display 41, taking into consideration the HMD orientation, a virtual representation 9 of the simulated object feature superimposed on the real-time surrounding-showing video stream 6. The simulated object feature may e.g. comprise a simulated other vehicle, a simulated road user, and/or a simulated moving and/or fixed obstacle. Thus, as shown with support from FIG. 4 and further from FIGS. 1, 2, 3 and 5, the virtual representation 9 of the simulated object feature is overlaid the real-world video stream 6 to be temporally and spatially commensurate with the video stream 6 such that said video stream 6 appears as a background overlaid with—in addition to the virtual design feature representation 7—said virtual functionality feature representation 9. Accordingly, upon in real-time superimposing a virtual representation 9 of a simulated object feature—such as for instance a virtual pedestrian appearing to cross the road in front of the road-driven vehicle 2—on the surrounding-showing video stream 6, said simulated object feature and/or an effect it has on the HMD-wearing occupant 3—who for instance may be the driver of the road-driven vehicle 2—may be evaluated, e.g. while said road-driven vehicle 2 is driven in real traffic and/or along actual roads. Consequently, the simulated object feature—and/or an effect it has on the HMD-wearing occupant 3—may be evaluated in real traffic and/or in real road-driving scenarios, which thus enables said simulated object feature and/or the effect it has on the HMD-wearing occupant 3 to be evaluated under more reality-resembling conditions and/or in a more reality-resembling environment than should said evaluation be performed in e.g. a commonly known static or dynamic rig displaying the environment and traffic on large scale screens in front of a vehicle mock-up.

Action 1007

In optional Action 1007, the vehicle feature evaluation system 1 may update—e.g. by means of the user interaction updating unit 107—the virtual functionality feature representation 8 based on a user interaction with the simulated vehicle functionality feature. Thereby, interaction by a user with the simulated vehicle functionality feature may result in that the virtual representation 8 of the simulated vehicle functionality feature is updated in accordance with said interaction. Thus, as shown with support from at least FIGS. 1, 2, 3 and 5, user interaction with the simulated vehicle functionality feature—e.g. represented by selectable options available on the exemplifying simulated vehicle display—may result in that a user selected option is carried out and/or updated in accordance with the user interaction, which subsequently is reflected by the corresponding virtual feature 8—here the virtual infotainment display 8—being updated in accordance therewith. Optionally, said user interaction may be based on detection, by means of one or more user interaction sensors, of a user in and/or at the fictive functionality feature location 80. Thus, as shown with support from at least FIGS. 1, 2, 3 and 5, presence of a user, e.g. the HMD-wearing occupant 3, and/or e.g. a finger of said user/occupant 3, may be sensed in or at the position in the vehicle 2 representing the location of the simulated vehicle functionality feature, in FIGS. 1-3 in or at essentially the centre of the vehicle dashboard of the road-driven vehicle 2 and/or the virtual dashboard 7, whereby the virtual representation 8 of the simulated vehicle functionality feature, here the simulated infotainment display, subsequently may be updated in accordance with said presence, and/or in accordance with the geographical position and/or the nature of said presence. User interaction may be detected in any arbitrary manner known in the art, e.g. by means of one or more user interaction sensors and/or the user interaction determining system 1070 shown in FIG. 5, for instance comprising touch sensor(s), camera(s) and/or position detection sensor(s) worn by the user e.g. on his/her hand and/or finger.

Action 1008

In optional Action 1008, the vehicle feature evaluation system 1 may update—e.g. by means of the vehicle signal updating unit 1008—the virtual functionality feature representation 8' based on a vehicle signal affecting the simulated vehicle functionality feature, derived from the road-driven vehicle 2. Thus, as shown with support from at least FIGS. 1, 2, 3 and 5, deriving a vehicle signal which affects the simulated vehicle functionality feature—e.g. resulting from manoeuvring of the road-driven vehicle 2—may result in that the virtual representation 8' of the simulated vehicle functionality feature, in FIGS. 1 and 3 the virtual information display 8', is updated in accordance therewith. That is, deriving—from the road-driven vehicle 2—a vehicle signal affecting the simulated vehicle functionality feature, where the vehicle signal for instance comprises vehicle data such as e.g. fuel consumption and where the simulated vehicle display shows said vehicle data e.g. fuel consumption, may result in that the virtual feature 8'—in FIGS. 1 and 3 the exemplifying virtual information display 8'—is updated in accordance with said vehicle signal, i.e. the fuel consumption value shown on the virtual information display 8' is updated along with the received updated fuel consumption value. The vehicle signal may be derived from the road-driven vehicle 2 in any arbitrary known manner, for instance via wired and/or wireless communication therewith, and/or with support from the vehicle signal determining system and/or unit 1080 adapted for determining which input derived from the road-driven vehicle 2 affects the simulated vehicle functionality feature.

Action 1009

In optional Action 1009, the vehicle feature evaluation system 1 may update—e.g. by means of the continuous updating unit 109—the real-time surrounding-showing video stream 6, the superimposed virtual design feature representation 7, the superimposed virtual functionality feature representation 8 and/or the superimposed virtual object feature representation 9 based on updated captured image data 211 and/or based on updated determined HMD orientation. Thus, as shown with support from at least FIGS. 1-5, it is provided that the real-time video stream 6 and/or the virtual representation(s) 7, 8, 9 are continuously updated to reflect updated captured image data 211 and/or updated orientation of the HMD.

The person skilled in the art realizes that the present disclosure by no means is limited to the preferred embodiments described above. On the contrary, many modifications and variations are possible within the scope of the appended claims. It should furthermore be noted that the drawings not necessarily are to scale and the dimensions of certain features may have been exaggerated for the sake of clarity. Emphasis is instead placed upon illustrating the principle of the embodiments herein. Additionally, in the claims, the word "comprising" does not exclude other elements or steps, and the indefinite article "a" or "an" does not exclude a plurality.

The invention claimed is:

1. A method performed by a vehicle feature evaluation system for enabling evaluation of a simulated vehicle-related feature, the method comprising:
   determining in relation to a road-driven vehicle, with support from a tracking system, an orientation of a head mounted display, HMD, adapted to be worn by an occupant on-board the road-driven vehicle;
   determining a simulated vehicle design feature to be evaluated in the road-driven vehicle; and
   providing in real-time to a HMD display of the HMD, taking into consideration the HMD orientation, a virtual representation of the simulated vehicle design feature superimposed on a real-time surrounding-showing video stream derived from real-world image data captured with support from one or more vehicle-attached cameras adapted to capture surroundings external of the road-driven vehicle, wherein the virtual representation of the simulated vehicle design feature replaces an excluded portion of the real-time surrounding-showing video stream, and wherein the virtual representation of the simulated vehicle design feature and the replaced excluded portion of the real-time surrounding-showing video stream are varied based on the HMD orientation.

2. The method according to claim 1, wherein the simulated vehicle design feature comprises one or more of a simulated vehicle interior section and a simulated vehicle exterior section.

3. The method according to claim 1, further comprising:
   determining a simulated vehicle functionality feature to be evaluated in the road-driven vehicle;
   wherein the providing further comprises additionally providing in real-time to the HMD display, taking into consideration the HMD orientation, a virtual representation of the simulated vehicle functionality feature superimposed on the real-time surrounding-showing video stream, which simulated vehicle functionality feature comprises one or more of:
   a simulated vehicle human machine interface, HMI;
   a simulated vehicle display;
   a simulated vehicle head-up display, HUD;
   simulated light characteristics; and
   a simulated effect resulting from a simulation of the simulated vehicle functionality feature.

4. The method according to claim 1, further comprising:
   determining a simulated object feature to be evaluated in the road-driven vehicle;
   wherein the providing further comprises additionally providing in real-time to the HMD display, taking into consideration the HMD orientation, a virtual representation of the simulated object feature superimposed on the real-time surrounding-showing video stream, which simulated object feature comprises one or more of:
   a simulated other vehicle;
   a simulated road user; and
   a simulated moving or fixed obstacle.

5. The method according to claim 4, further comprising one or more of:
   updating the virtual functionality feature representation based on a user interaction with the simulated vehicle functionality feature, which user interaction for instance is based on detection, by means of one or more user interaction sensors, of a user in and/or at the fictive functionality feature location; and/or
   updating the virtual functionality feature representation based on a vehicle signal affecting the simulated vehicle functionality feature, derived from the road-driven vehicle.

6. The method according to claim 1, further comprising:
   determining one or more of:
   a fictive design feature location of the simulated vehicle design feature relative the road-driven vehicle;
   a fictive functionality feature location of the simulated vehicle functionality feature relative the road-driven vehicle; and
   a fictive object feature location of the simulated object feature relative the road-driven vehicle;
   wherein the providing taking into consideration the HMD orientation comprises one or more of:
   providing the virtual design feature representation superimposed on the real-time surrounding-showing video stream such that positioning of the virtual design feature representation corresponds to the fictive design feature location;

providing a virtual functionality feature representation superimposed on the real-time surrounding-showing video stream such that positioning of the virtual functionality feature representation corresponds to the fictive functionality feature location; and providing the virtual object feature representation superimposed on the real-time surrounding-showing video stream such that positioning of the virtual object feature representation corresponds to the fictive object feature location.

7. The method according to claim 1, further comprising one or more of:

updating:

the real-time surrounding-showing video stream;

the superimposed virtual design feature representation;

a superimposed virtual functionality feature representation; and a superimposed virtual object feature representation based on updated captured image data and/or based on updated determined HMD orientation.

8. A vehicle feature evaluation system for enabling evaluation of a simulated vehicle-related feature, the vehicle feature evaluation system comprising:

a HMD orientation determining unit comprising memory storing instructions executed by a processor for determining in relation to a road-driven vehicle, with support from a tracking system, an orientation of a head mounted display, HMD, adapted to be worn by an occupant on-board the road-driven vehicle;

a design feature determining unit comprising memory storing instructions executed by the processor for determining a simulated vehicle design feature to be evaluated in the road-driven vehicle; and a HMD providing unit comprising memory storing instructions executed by the processor for providing in real-time to a HMD display of the HMD, taking into consideration the HMD orientation, a virtual representation of the simulated vehicle design feature superimposed on a real-time surrounding-showing video stream derived from real-world image data captured with support from one or more vehicle-attached cameras adapted to capture surroundings external of the road-driven vehicle, wherein the virtual representation of the simulated vehicle design feature replaces an excluded portion of the real-time surrounding-showing video stream, and wherein the virtual representation of the simulated vehicle design feature and the replaced excluded portion of the real-time surrounding-showing video stream are varied based on the HMD orientation.

9. The vehicle feature evaluation system according to claim 8, wherein the simulated vehicle design feature comprises one or more of a simulated vehicle interior section and a simulated vehicle exterior section.

10. The vehicle feature evaluation system according to claim 8, further comprising:

a functionality feature determining unit comprising memory storing instructions executed by the processor for determining a simulated vehicle functionality feature to be evaluated in the road-driven vehicle;

wherein the HMD providing unit is adapted for additionally providing in real-time to the HMD display, taking into consideration the HMD orientation, a virtual representation of the simulated vehicle functionality feature superimposed on the real-time surrounding-showing video stream, which simulated vehicle functionality feature comprises one or more of:

a simulated vehicle human machine interface, HMI;

a simulated vehicle display;

a simulated vehicle head-up display, HUD;

simulated light characteristics; and a simulated effect resulting from a simulation of the simulated vehicle functionality feature.

11. The vehicle feature evaluation system according to claim 8, further comprising:

an object feature determining unit comprising memory storing instructions executed by the processor for determining a simulated object feature to be evaluated in the road-driven vehicle;

wherein the HMD providing unit is adapted for additionally providing in real-time to the HMD display, taking into consideration the HMD orientation, a virtual representation of the simulated object feature superimposed on the real-time surrounding-showing video stream, which simulated object feature comprises one or more of:

a simulated other vehicle;

a simulated road user; and a simulated moving or fixed obstacle.

12. The vehicle feature evaluation system according to claim 11, further comprising one or more of:

a user interaction updating unit comprising memory storing instructions executed by the processor for updating the virtual functionality feature representation based on a user interaction with the simulated vehicle functionality feature, which user interaction for instance is based on detection, by means of one or more user interaction sensors, of a user in and/or at the fictive functionality feature location; and a vehicle signal updating unit comprising memory storing instructions executed by the processor for updating the virtual functionality feature representation based on a vehicle signal affecting the simulated vehicle functionality feature, derived from the road-driven vehicle.

13. The vehicle feature evaluation system according to claim 8, further comprising:

a location determining unit comprising memory storing instructions executed by the processor for determining one or more of:

a fictive design feature location of the simulated vehicle design feature relative the road-driven vehicle;

a fictive functionality feature location of the simulated vehicle functionality feature relative the road-driven vehicle; and a fictive object feature location of the simulated object feature relative the road-driven vehicle;

wherein the HMD providing unit further is adapted for one or more of:

providing the virtual design feature representation superimposed on the real-time surrounding-showing video stream such that positioning of the virtual design feature representation corresponds to the fictive design feature location;

providing a virtual functionality feature representation superimposed on the real-time surrounding-showing video stream such that positioning of the virtual functionality feature representation corresponds to the fictive functionality feature location; and providing the virtual object feature representation superimposed on the real-time surrounding-showing video stream such that positioning of the virtual object feature representation corresponds to the fictive object feature location.

14. The vehicle feature evaluation system according to claim 8, further comprising one or more of:
- a continuous updating unit comprising memory storing instructions executed by the processor for updating:
- the real-time surrounding-showing video stream;
- the superimposed virtual design feature representation;
- a superimposed virtual functionality feature representation; and
- a superimposed virtual object feature representation based on updated captured image data and/or based on updated determined HMD orientation.

15. A vehicle comprising a vehicle feature evaluation system according to claim 8.

* * * * *